(12) United States Patent
Cheng et al.

(10) Patent No.: US 7,521,094 B1
(45) Date of Patent: Apr. 21, 2009

(54) METHOD OF FORMING POLYMER FEATURES BY DIRECTED SELF-ASSEMBLY OF BLOCK COPOLYMERS

(75) Inventors: Joy Cheng, San Jose, CA (US); William D. Hinsberg, San Jose, CA (US); Ho-Cheol Kim, San Jose, CA (US); Charles T. Rettner, San Jose, CA (US); Daniel P. Sanders, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/013,957

(22) Filed: Jan. 14, 2008

(51) Int. Cl.
*B05D 3/00* (2006.01)

(52) U.S. Cl. .................. 427/532; 427/385.5; 427/558; 430/315

(58) Field of Classification Search .............. 427/532, 427/385.5, 558
See application file for complete search history.

(56) References Cited

U.S. PATENT DOCUMENTS

| | | | |
|---|---|---|---|
| 6,106,998 | A | 8/2000 | Maeda et al. |
| 6,352,813 | B2 | 3/2002 | Nakano et al. |
| 6,746,825 | B2 | 6/2004 | Nealey et al. |
| 6,926,953 | B2 | 8/2005 | Nealey et al. |
| 2001/0021482 | A1 | 9/2001 | Nakano et al. |
| 2003/0091752 | A1 | 5/2003 | Nealey et al. |
| 2003/0118800 | A1 | 6/2003 | Thomas et al. |
| 2004/0175628 | A1 | 9/2004 | Nealey et al. |
| 2006/0078681 | A1 | 4/2006 | Hieda et al. |
| 2006/0134556 | A1 | 6/2006 | Nealey et al. |
| 2006/0249784 | A1 | 11/2006 | Black et al. |
| 2007/0175859 | A1 | 8/2007 | Black et al. |

OTHER PUBLICATIONS

Kim et al. (Self-Aligned, Self-Assembled Organosilicate Line Patterns of ~20 nm Half-Pitch from Block Copolymer Mediated Self-Assembly), Feb. 2007, Advances in Resist aterials and Processing Technology XXIV, Conference Article.*

(Continued)

*Primary Examiner*—Michael Kornakov
*Assistant Examiner*—Xiao Zhao
(74) *Attorney, Agent, or Firm*—Cantor Colburn LLP (57) ABSTRACT

Disclosed herein is a method of forming polymer structures comprising applying a solution of a diblock copolymer assembly comprising at least one diblock copolymer that forms lamellae, to a neutral surface of a substrate having a chemical pattern thereon, the chemical pattern comprising alternating pinning and neutral regions that are chemically distinct and which have a chemical pattern spatial frequency given by the number of paired sets of pinning and neutral regions along a given direction on the substrate; and forming domains comprising blocks of the diblock copolymer. The domains form by lateral segregation of the blocks. At least one domain has an affinity for the pinning regions and forms on the pinning region, the domains so formed on the pinning region are aligned with the underlying chemical pattern, and domains that do not form on the pinning region form adjacent to and are aligned with the domains formed on the pinning regions. In this way, a structure comprising repeating sets of domains is formed on the chemical pattern with a spatial frequency given by the number of repeating sets of domains in the given direction, that is at least twice that of the chemical pattern spatial frequency. Methods of forming the chemical patterns, and pattern transfer methods using patterned domains, are also disclosed.

1 Claim, 7 Drawing Sheets

OTHER PUBLICATIONS

R. Allen et al., "High Speed, Aquesous Developing Negative Resist Based on Triflic Acid Catalysed Epoxy Polymerization", Advances ins Resist Technology and Processing IX, 1992, pp. 513-525, vol. 1672.

P. Mansky et al., "Controlling Polymer-Surface Interactions with Random Copolymer Brushes", Science Mar. 7, 1997, pp. 1458-1460, vol. 275.

R. Peters et al., "Using Self-Assembled Monolayers Exposed to X-rays To Control the Wetting Behavior of Thin Films of Diblock Copolymers" Langmuir 2000, Feb. 18, 2000, pp. 4625-4631, American Chemical Society.

C. Park et al., "Enabling Nanotechnology with self assembled block copolymer patterns", Polymer, Jul. 29, 2003, pp. 6725-6760, 0032-3861, Elsevier.

D. Ryu et al., "A Generalized Approach to the Modification of Solid Surfaces", Science Apr. 8, 2005, pp. 236-239.

Ian Manners, "Synthetic metal-containing polymer" Wiley-VCH, 2004 (As referred to in the Specification as filed on p. 20, paragraph [0052]).

H. Ito, "Chemical Amplification Resists for Microlithography", Adv. Polym Sci, 2005, 37-245, DOI 10, 1007/B97574.

E. Freer et al., "Oriented Mesoporous Organosilicate Thin Films", NANO Letters Aug. 2, 2005, pp. 2014-2018, vol. 5, No. 10, American Chemical Society.

Applied Physics Newsletter, [online]; [retrieved on Jan. 21, 2008]; retrieved from the internet http://apl.aip.org/apl.copyright.jsp C.T. Black, "Self-aligned self assembly of multi-nanowire silicon field effect transistors", Applied Physics Letters, Oct. 13, 2005, 3p, vol. 87,163116, American Institute of Physics.

I. IN et al., "Side-Chain-Grafted Random Copolymer Brushes as Neutral Surfaces for Controlling the Orientation of Block Copolymer Microdomains in Thin Films". Langmuir, Jun. 8, 2006, pp. 7855-7860, 10.1021/la060478g, American Chemical Society.

Harvard University, [online]; [retrieved on Jun. 11, 2008]; retrieved from the Internet http://adsabs.harvard.edu/abs/2007APS . . . MARN17003H J. Han et al., "Adsorption and Fractionation of RAFT-Polymerized PS-b-PMMA Block Copolymers for 2D Liquid Chromatography, "America Physical Society, APS Mar. Meeting Abstract, Mar. 5/9, 2007, 2p.

J. Chai et al., "Assembly of Aligned Linear Metallic Patterns on Silicon", Nature Nanotechnology Aug. 3, 2007, pp. 500-506, vol. 2, Nature Publishing Group.

E. Han et al., "Photopatternable Imaging Layers for Controlling Block Copolymer Microdomain Orientation**", Advanced Material, Nov. 21, 2007, pp. 4448-4452, vol. 19. Wiley-VCH Verlag GmBH & Co., Weinheim.

J. Bang et al., "Facile Routes To Patterned Surface Neutralization Layers for Block Copolymer Lithography" Advanced Materials, Nov. 28, 2007, pp. 4552-4557vol. 19, Wiley-VCH Verlag GmBH & Co., Weinheimt al.

T.R. Albrecht, "Nanoimprint Lithography for Patterned Media", IEEE Lithography Workshop, Dec. 9-14, 2007, Rio Grande, Puerto Rico.

P. Nealey et al., "Directed Assembly of Triblock Copolymers" Patent Application, 48pgs, Beyer Weaver & Thomas, LLP,Oakland, CA, USA.

P. Nealey, "Methods and Compositions for Forming Patterns With Isolated or Discrete Features Using Block Copolymer Materials", Patent Application, 76pgs, Beyer Weaver & Thomas, LLP, Oakland, CA USA.

* cited by examiner

Graphoepitaxy

$L > P_{BCP}$ or $L \sim P_{BCP}$

↓ Coating BCP

↓ Etch

FIG. 1A

(PRIOR ART)

Chemical Epitaxy
on Dense Chemical Patterns

$P_S \sim P_{BCP}$

↓ Coating BCP

↓ Etch

FIG. 1B

(PRIOR ART)

METHOD OF FORMING POLYMER FEATURES BY DIRECTED SELF-ASSEMBLY OF BLOCK COPOLYMERS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

The invention relates to methods for aligning microdomains of block copolymers to chemical patterns that have a lower spatial frequency than the microdomains.

2. Description of Background

Patterns of ever smaller features having nanoscale critical dimensions (CD) allow denser circuitry to be created, thereby reducing overall production cost for electronic devices. Similarly, ever tighter pitches (i.e., feature spacing in a pattern) and smaller CDs are needed at each new technology node. Methods such as directed self-assembly of block copolymers (BCPs), in which the pitch of a pre-pattern defined by a lithography tool is subdivided, have been considered as potential candidates for extending the current lithography technique.

Figure 1A:
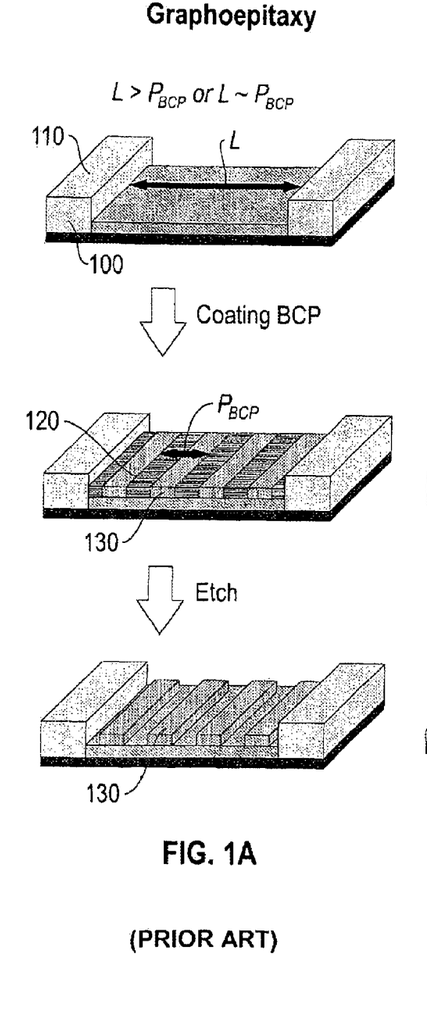
FIGS. 1A and 1B illustrate in schematic form the directed self-assembly of block copolymers by graphoepitaxy (FIG. 1A) and by chemical epitaxy on dense chemical patterns (FIG. 1B) to form domains based on each block, and formation of relief patterns by selective etch of one domain.
Figure 1B:
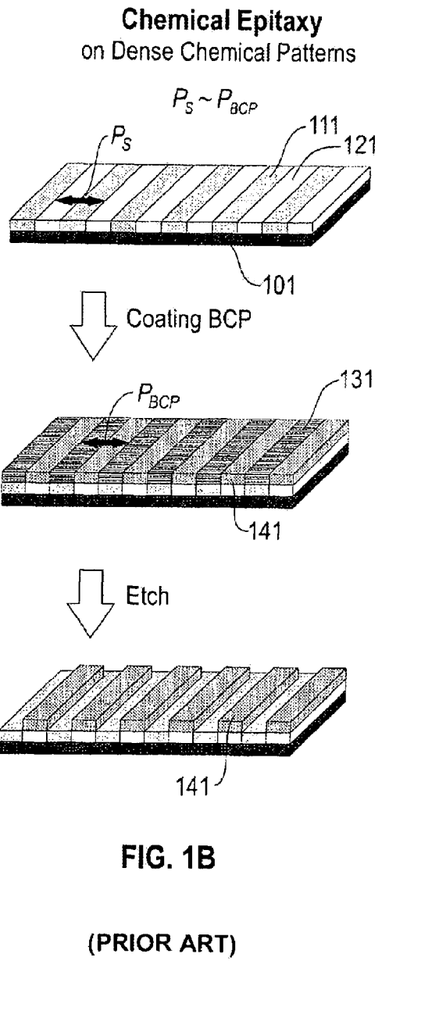

Two common methods used to guide self-assembly in BCP thin films are graphoepitaxy (FIG. 1A) and chemical epitaxy (FIG. 1B). In the graphoepitaxy method (FIG. 1A), self-organization of block copolymers is guided by pre-patterned substrates 100. Self-aligned lamellar BCPs can form parallel line-space patterns of different domains (120, 130) in the topographical trenches and enhance pattern resolution by subdividing the space of topographical patterns 110. FIG. 1A shows in schematic form directed self-assembly of block copolymers on topographical patterns. A topographically patterned substrate 100 with a neutral underlying surface and sidewalls that are preferentially wetted by one type of the block copolymer domain (for example, the A domains of an A-B diblock copolymer assembly) can be used to direct self-assembly inside the trench through topographical confinement. With a trench of width L and BCP with a periodicity of $P_{BCP}$, frequency multiplication of a factor of $L/P_{BCP}$ can be achieved for the remaining domain 130 after etch; however, defects and line-edge roughness are easily induced in this directed self-assembly scheme. If the sidewalls are neutral, the lamellae tend to orient perpendicular to the sidewalls and will not subdivide the pitch along the desired direction.

In the chemical epitaxy method, the self-assembly of BCP domains is guided by dense chemical patterns with the same dimension on the substrate ($P_S \sim P_{BCP}$). The affinity between the chemical patterns and at least one of the types of BCP domains results in the precise placement of the different BCP domains on respective corresponding regions of the chemical patterns. (See FIG. 1B, which shows dense chemical patterns (111, 121) on a pre-patterned substrate 101, in which BCP domains 131 and 141 align to the chemical patterns, forming a pattern corresponding to the remaining domain 141 after etch.) The affinity for the one type of domain (for example the A domains of an A-B diblock copolymer assembly) dominates the interaction of the other domain(s) (for example the B domains) with the non-patterned regions of the surface, which can be selective or non-selective towards the other type(s) of domains. As a result, the pattern formation in the resulting BCP assembly directly mirrors the underlying chemical pattern (i.e., is a one-for-one reproduction of the features of the chemical pre-pattern. However, dimension control and line-edge roughness can be improved in such patterning methods by reducing variation in chemical pre-patterns. As a result, the pattern formation in the resulting BCP assembly directly mirrors the underlying chemical pattern (i.e., is a one-for-one reproduction of the features of the chemical pre-pattern).

Both graphoepitaxy and chemical epitaxy methods have been demonstrated. However, each of these two methods has limited use in generating patterns with high resolution and low CD variations, for different reasons. For example, in graphoepitaxy, the placement accuracy and edge roughness of BCP domains deteriorates during pattern formation due to variation in thickness uniformity of the over-coating of polymer film and due to imperfections in the topographical pre-patterns. The graphoepitaxy process also typically results in formation of a half-width domain next to each of the sidewalls so that the pattern spacing across the subdivided channel is not uniform. In addition, graphoepitaxy is very process intensive, requiring multiple fabrication steps (i.e., multiple lithographic patterning and etching steps) to create the topographic patterns and, frequently also requiring treatment to control the wetting properties of either the bottom or sidewalls of the patterns prior to performing the self-assembly process with a BCP. Chemical epitaxy on dense chemical patterns, though realizing a gain in CD control, provide no resolution enhancement when employing diblock copolymers. In addition, the 1:1 patterning of the chemical patterns at nanoscale feature sizes (100 nm or less) exceeds the capabilities of state-of-the-art optical lithography tools. Therefore, serial techniques like direct write e-beam lithography or parallel techniques like extreme-ultraviolet (EUV) interferometry are required. Patterning dense 1:1 features of this size with e-beam lithography is exceedingly difficult and requires enormous write times, making the throughput of the process too low (and the cost-of-ownership too high) to be practical. EUV interferometry remains an exotic technique with few production tools (especially EUV sources) available, suffers from similar throughput and cost-of-ownership issues, and has the typical practical limitations associated with interferometric techniques. Therefore, due to the aforementioned limitations, a directed self-assembly method to enhance resolution while reducing CD variation would therefore be highly desirable.

SUMMARY OF THE INVENTION

The shortcomings of the prior art are overcome and additional advantages are provided through the provision of, in an embodiment, a method of forming polymer structures comprising applying a solution of a diblock copolymer assembly comprising at least one diblock copolymer that forms lamellae, to a neutral surface of a substrate having a chemical pattern thereon, the chemical pattern comprising alternating pinning and neutral regions that are chemically distinct and have a first spatial frequency given by the number of paired sets of pinning and neutral regions along a given direction on the substrate; and forming domains comprising blocks of the diblock copolymer, wherein the domains form by lateral segregation of the blocks, wherein at least one domain has an affinity for the pinning regions and forms on the pinning region, and wherein the domains so formed are aligned with the underlying chemical pattern, wherein domains that do not form on the pinning region form adjacent to and are aligned with the domains formed on the pinning regions, such that a structure comprising repeating sets of domains is formed on the chemical pattern with a second spatial frequency given by the number of repeating sets of domains in the given direction, the second spatial frequency being at least twice that of the first spatial frequency.

In another embodiment, a method of forming polymer structures comprises applying a solution of a block copolymer assembly comprising at least one block copolymer, to a neutral surface of a substrate having a chemical pattern thereon, the chemical pattern comprising alternating pinning and neutral regions which are chemically distinct and which have a first spatial frequency given by the number of paired sets of pinning and neutral regions along a given direction on the substrate; and forming domains comprising blocks of the block copolymer, where the domains form by lateral segregation of the blocks, wherein at least one domain has an affinity for and forms on the pinning regions, and the pinning regions pin domains having the greatest affinity, such that a structure comprising repeating sets of pinned domains and domains aligned with the pinned domains is formed on the surface, the structure having a second spatial frequency given by the number of repeating sets of domains in the given direction, the second spatial frequency being at least twice that of the first spatial frequency.

In another embodiment, a method of forming polymer structures comprises applying a solution of a block copolymer assembly comprising at least one block copolymer, to a neutral surface of a substrate having a chemical pattern thereon, the chemical pattern comprising alternating pinning and neutral regions that are chemically distinct and have a first spatial frequency given by the number of paired sets of pinning and neutral regions along a given direction on the substrate; and forming domains of the block copolymer which form by lateral segregation of the blocks in accordance with the underlying chemical pattern, wherein at least one domain of the block copolymer assembly has an affinity for the pinning regions, and wherein a structure extending across the chemical pattern is produced, the structure having a uniform second spatial frequency given by the number of repeating sets of domains in the given direction that is at least twice that of the first spatial frequency.

In a specific embodiment, the chemical patterns can be formed by: (a) protecting areas of the neutral surface of the substrate with a patterned resist layer, thereby leaving unprotected areas of the neutral surface of the substrate, (b) generating pinning regions on the unprotected areas of the neutral surface of the substrate by i) treating the unprotected areas of the neutral surface of the substrate with a chemical treatment, radiation treatment, or plasma treatment, ii) depositing a layer of material on the unprotected areas of the neutral surface of the substrate to produce a surface having an affinity for at least one domain of the block copolymer assembly, or iii) both i) and ii), and (c) removing the patterned resist material to uncover the neutral regions of the neutral surface of the substrate.

In another specific embodiment, the chemical patterns can be formed by directing ultraviolet, x-ray, ion beam, or e-beam irradiation onto the neutral surface of the substrate to generate exposed regions, wherein the exposed regions have different chemical properties than unexposed regions of the neutral surface of the substrate. Alternatively, in another specific embodiment, the chemical patterns can be formed by forming a neutral layer pattern-wise on a non-neutral substrate to form uncovered regions and covered regions covered by the patterned neutral layer, wherein the uncovered regions of the non-neutral surface are the pinning regions and have different chemical properties than the regions covered by the patterned neutral layer.

In an embodiment, the chemical pattern is non-contiguous and comprises dashes and/or dots, wherein the spacing and alignment of the dashes and/or dots are such that domains formed on the non-contiguous pattern assemble to form a contiguous pattern of domains. A fraction of the domains corresponding to the domains having the greatest affinity is not pinned, and in a specific embodiment, at least 50% of the domains having the greatest affinity are not pinned.

In another embodiment, a domain of the block copolymer assembly is selectively removed to generate a topographical pattern in the block copolymer assembly, and the topographic pattern in the block copolymer assembly is transferred to the substrate by an etching process.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution which provides a cost effective method for increasing pattern density and enhancing resolution of line-space patterns on substrates for electronic applications by self-assembly of block copolymers to form polymer structures, thereby increasing device feature density, without need for either higher resolution optical lithography or additional time consuming direct write methods. The methods described herein also advantageously improve line-edge roughness and line width variation, and compensate for pattern imperfections in the template patterns by the self-assembly of the block copolymers in creating the polymer structures, thereby increasing yields and dramatically decreasing cycle time for devices prepared using high-throughput pattern writing methods, such as in the use of imperfect or intermittent e-beam direct write patterns to provide high-quality line space polymer structures with regular patterns.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Disclosed herein is a method of enhancing resolution of nanometer-scale features based on directed self-assembly of block copolymers (BCPs) on sparse chemical patterns. Surprisingly, it has been found that when block copolymers capable of self assembly to form regular domains, are applied to a patterned surface having repeating chemically distinct regions that have a larger pitch than the block copolymer assembly, some of the domains selectively form on and align with portions of the sparse chemical pattern (i.e., are pinned to the chemical pattern). The pitch of the sparse chemical pattern is larger than the pitch of the block copolymer assembly, and the domains of the block copolymer assembly that do not form on the selective portion of the sparse chemical pattern align to the domains that are pinned, multiplying the spatial frequency of the sparse chemical pattern (given by the number of repeating sets of features along a given direction of the chemical pattern) so that the resulting pattern in the block copolymer assembly (i.e., the spatial frequency of the patterned block copolymer assembly) can be doubled, tripled, even quadrupled relative to the spatial frequency of the original sparse chemical pattern. The resulting block copolymer assembly also desirably has improved line edge roughness relative to the original chemical pattern, and thus can be used in applications where the original chemical pattern is of poor quality, or where for reasons of manufacturing throughput and cycle time, it is desirable or even necessary to provide a low quality chemical pattern.

As used herein, the phrase "sparse chemical pattern", also referred to herein simply as a "chemical pattern", means a lithographically defined pattern on a neutral surface of a substrate, comprising repeating alternating chemically heterogeneous surface features such as regularly spaced lines, segments of lines, dashes, or dots that follow a pattern that is, for example, straight, curved, concentric, or the like. Patterns of dots can be useful as precursors to lines, line segments, holes, posts, or similar features, or other desirable features that can be patterned with regularity, and in which one feature of the repeating chemical pattern is smaller than the other. As used herein, the term "neutral" refers to a surface that does not exhibit a selectivity to one block over another. As used herein, the phrase "block copolymer assembly" refers to a composition comprising a block copolymer that forms microdomains. The block copolymer assembly is deposited on and orients to this sparse chemical pattern.

As used herein, "phase-separate" refers to the propensity of the blocks of the block copolymers to form discrete microphase-separated domains, also referred to as "microdomains" and also simply as "domains". The blocks of the same monomer aggregate to form periodic domains, and the spacing and morphology of domains depends on the interactions, volume fractions, and number of different blocks in the block copolymer. Domains of block copolymers can form during applying, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for reducing or removing defects in the layer of lateral microphase-separated domains, and generally involves heating at elevated temperature above the glass transition temperature of the block copolymers, for a period of time (e.g., several minutes to several days) at or near the end of the film-forming process.

Figures 2A, 2B:
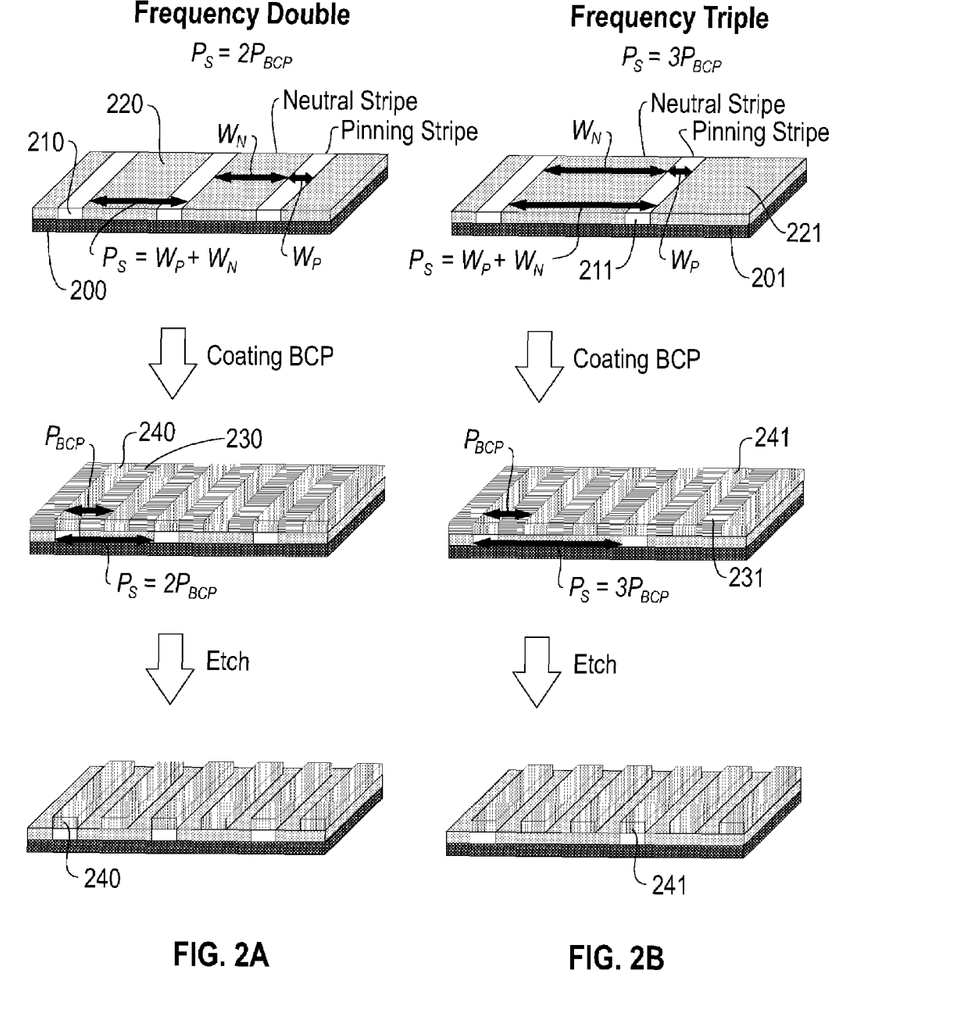
FIGS. 2A and 2B illustrate in schematic form the directed self-assembly of block copolymers on sparse chemical patterns with spatial frequency doubling (FIG. 2A) and tripling (FIG. 2B) to form domains based on each block, and formation of relief patterns by selective etch of one domain.

FIG. 2 schematically shows directed self-assembly of BCPs on sparse chemical patterns. The sparse chemical patterns comprise alternating pinning stripes (210, 211) of width $W_P$ and neutral stripes (220, 221) of width $W_N$ ($W_N=P_S-W_P$) on a substrate (200, 201). The pinning stripe, as defined herein, comprises one of the features having higher affinity for one block of the BCP resulting in selective, preferential deposition of domains (240, 241) formed from the polymer blocks on the pinning stripe, effectively fixing the domains to the pinning stripe. This property, referred to as "pinning", establishes and directs the spatial location of the particular polymer domain on a surface having the chemical pattern. The neutral stripe (220, 221), as opposed to the pinning stripe (210, 211), is equally wetted by each domain (230 and 240, 231 and 241) in a thin film comprising the BCP assembly. The factor of frequency multiplication is determined by the ratio of the pitch of sparse chemical patterns of paired pinning and neutral stripes ($P_S$) and the pitch of alternating BCP domains ($P_{BCP}$). FIGS. 2A and 2B each show sparse chemical patterns comprised of alternating pinning stripes 210, 211 (width=$W_P$=0.5*$P_{BCP}$) and neutral stripes (220, 221) (width=$W_N$=$P_S$−$W_N$). Spatial frequency doubling of a domain 240 after etch can be achieved by using a sparse chemical pattern with $P_S/P_{BCP}$=2 as shown in FIG. 2A. Spatial frequency tripling of a domain 241 after etch can be achieved by using a sparse chemical pattern with $P_S/P_{BCP}=3$ as shown in FIG. 2B.

The sparse chemical pattern itself has a pitch ($P_S$) greater than the pitch of the block copolymer assembly ($P_{BCP}$) (see FIG. 2) so that at least two repeating BCP assembly periods form on a single period of the lithographically defined sparse chemical pattern. For this reason, it is necessary that the areas between the repeating pinning regions be neutral. In addition, it is advantageous where the width of the repeating pinning regions is smaller than the width of the repeating neutral regions (i.e. $W_P$ is approximately or less than one-half of $W_N$), for example to reduce pattern write times, and the like. In addition, $W_P$ is preferably similar to the width of one of the types of domains (i.e. $W_P \sim 0.5*P_{BCP}$ with a symmetric diblock copolymer), although it can be large enough to fully encompass two or more domains if, for example, multiblock (e.g., triblock, tetrablock, and the like) copolymers are used.

For example, using a symmetric PS-b-PMMA diblock copolymer having weight averaged molecular weights (Mw) for each of the blocks of 18,000 g/mol, with domains about 14.4 nm wide (for a 28.8 nm pitch), frequency doubling can be obtained where pinning stripes of 10 nm, 15 nm, or 20 nm width at pitches of 57.5 nm, 60 nm, and 62.5 nm (respectively) with low defectivity (i.e., where no defects are observed in a randomly selected pattern area with dimensions of 1.5 μm by 5 μm). At a pitch of 55 nm, pinning stripes of 10 nm or 15 nm width have been found to be effective as well. For frequency tripling using the same block copolymer, pinning stripes of 10 nm and 15 nm width on a 57.5 nm pitch were both found to be effective with only a few observable defects in a 1.5 μm by 5 μm area. The effective pinning region widths (and pinning region widths relative to the neutral region widths) will vary depending upon the block copolymers and chemical patterns used. It will be understood that the values disclosed above are exemplary should not be considered to be limiting. Thus, in an embodiment, the width of the pinning regions is less than or equal to about one-half of the width of the neutral regions, and wherein the width of the pinning regions is about the same as the width of at least one of the domains in the block copolymer assembly. The structure comprising repeating sets of domains can, in an embodiment, have a second spatial frequency of at least three times that of the first spatial frequency.

Once applied to the chemically patterned substrate, the domains of BCP assembly organize over the attractive (wettable) pinning stripes. The orientation of the remaining BCP assembly domains which organize over the neutral areas is controlled by the orientation of the domains which are strongly pinned by the underlying chemical pattern. As a result, the overall organization of the BCP assembly is controlled by matching the preferred domains to the underlying sparse chemical patterns while simultaneously minimizing the interfacial energy between the BCP assembly thin film and the surface of the substrate. In this way, frequency multiplication of the sparse chemical pattern can be achieved, as defined by the factor $P_S/P_{BCP}$. For example, a chemical pattern with a period equal to twice that of a block copolymer ($P_S=2P_{BCP}$ and $W_P=0.5P_{BCP}$ in FIG. 2A) can be used to direct BCP self-assembly to double the frequency of line-space patterns. Higher frequency multiplication can be achieved by using chemical patterned substrates with larger $P_S/P_{BCP}$ ratio. For example, as shown in FIG. 2B, the pattern of the BCP assembly can also be tripled, or quadrupled (not shown). It will be understood that in principle there is no limit to the frequency multiplication contemplated by the invention disclosed herein, and that the above exemplary embodiments are meant to be illustrative and should not be considered as limiting. Higher spatial frequency multiplication may also be achieved (i.e., quintupling, and the like) subject only to considerations of acceptable levels of defectivity that may occur in the resulting patterned BCP assembly produced at the higher spatial frequencies (e.g., quintupling or higher).

Figure 6A:
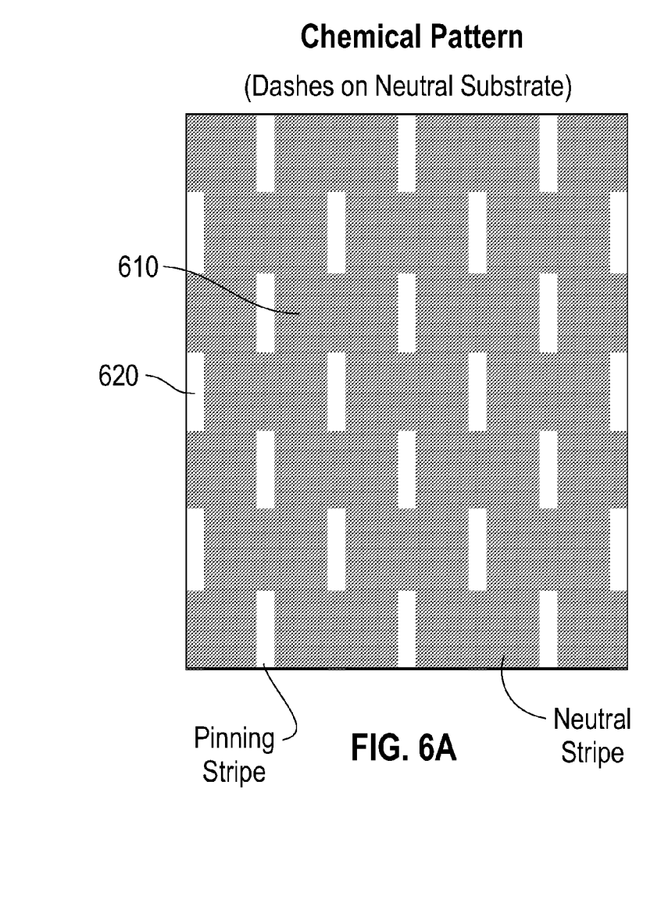
FIG. 6 illustrates an exemplary embodiment in which an intermittent chemical pattern of dashes (FIG. 6A) provides a contiguous pattern of aligned domains (FIG. 6B).
Figure 6B:
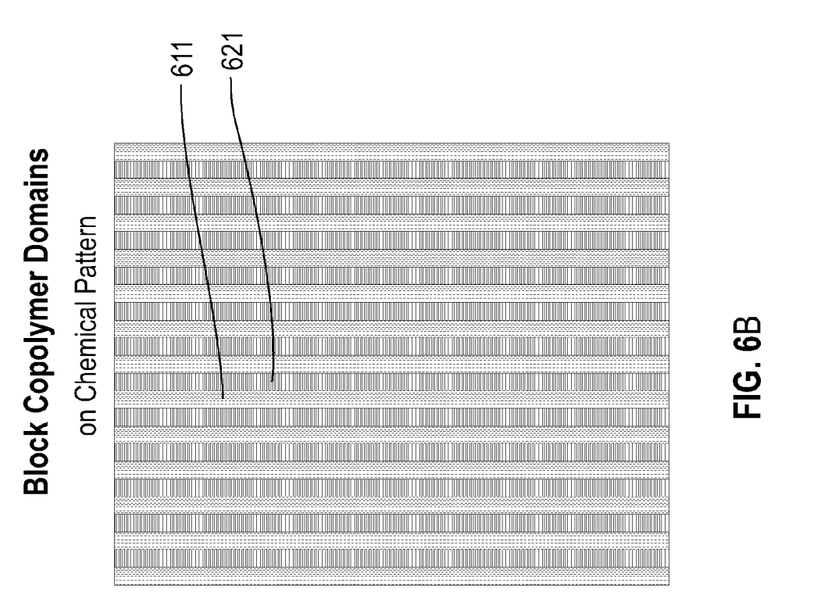

Advantageously, the sparse chemical pattern can be imaged on the neutral surface of the substrate using low resolution techniques such as patterns of dashes or dots, rather than using contiguous patterns as would be obtained using unbroken lines. This feature is illustrated in FIGS. 5 and 6. In FIG. 5, a pattern comprising alternating lines and parallel patterns of dashes (FIG. 5A) are shown. Upon forming the domains upon these patterns, the domains align to the lines as well as the dashes, and due to the ability of unpinned domains to align with regularity of size and shape to domains formed on intermittent pinning regions, the aligned domains having frequency multiplication (FIG. 5B) can form patterns comparable to those formed on contiguous patterns. FIG. 6A shows a pattern of alternating dashes, with no solid lines in the pattern. Similar to the use of both lines and dashes, domains aligned only to dashed lines can provide frequency multiplication with alignment to form contiguous domain patterns over non-contiguous chemical patterns. In a further advantage, the use of lines or dashes with high line-edge roughness and line-width roughness is tolerated by this patterning method, as the domains upon forming can correct any defects of alignment in a "self-healing" mechanism. In addition, for applications involving electron-beam lithography, writing dashed lines and/or dotted lines takes less writing time (and/or requires a lower energy dose) than writing a solid line, and so the cost and time for preparing the sparse chemical patterns with such non-contiguous lines can each be advantageously reduced. Thus, in an embodiment, a chemical pattern can be non-contiguous, comprising dashes and/or dots. The spacing and alignment of the dashes and/or dots are such that domains formed on the non-contiguous pattern assemble to form a contiguous pattern of domains in which the incidence of defects is minimized.

Similar resolution enhancement techniques based on sparse chemical patterns can be used to fabricate arrays of holes or posts. For example, coating a cylinder-forming BCP film of pitch, $P_{BCP}$ (center-to-center distance between nearest cylinders) on a sparse chemical pattern consisting of hexagonally packed pinning dots of pitch, $P_S$, and neutral surface outside the dot areas will allow frequency multiplication of lithographically defined dots. Similar to line-space patterns, the frequency multiplication of hole/post arrays of a factor of $P_S/P_{BCP}$ can be achieved.

Thus, in an embodiment, a method of forming polymer structures comprises applying a solution of a block copolymer assembly comprising at least one block copolymer to a neutral surface of a substrate having a chemical pattern thereon.

Substrates useful in the method disclosed herein can be any substrate suitable for providing a neutral surface. In an embodiment, neutral substrates can include: a crosslinked organic polymer including an epoxy-based homopolymer or copolymer, a surface modified organic homopolymer or copolymer, a self-assembled monolayer, a polymer brush-modified layer, or a cross-linked organosilicate.

Polymer brushes can provide a neutral surface, in which the surface is reactively modified to the desired thickness and surface energy using polymeric brush precursors with a desired composition, often followed by an additional rinse step to remove non-bound material. The composition of a random copolymer brush layer is tuned to afford the desired neutral surface. This can be accomplished in some instances by randomly copolymerizing two monomers, for example the same monomers used in the block copolymer (for the block copolymer assembly), in a precise ratio. In instances where otherwise useful block copolymers (i.e., those that can form microdomains) exist for which it is unfeasible to synthesize random copolymers of repeating units of each block (such as where different polymerization mechanisms would be required), end-group functionalization or incorporation of reactive-group containing monomers can be used to functionalize a polymers to provide grafting sites. [See e.g., P. Mansky, Y. Liu, E. Huang, T. P. Russell, C. Hawker, "Controlling polymer surface interaction with random copolymer brushes", *Science,* 275, 1458, (1997).] Thermally crosslinkable underlayers based on, for example, vinyl benzocyclobutene, may also be used. [See e.g., Du Yeol Ryu, Kyusoon Shin, Eric Drockenmuller, Craig J. Hawker, and Thomas P. Russell, "A generalized approach to modification of solid surfaces" *Science,* 308, 236, (2005)]. Photopatternable underlayers, based on random copolymers of the monomers of the block copolymer with an appropriate functional monomer, for example, monomers having azide, glycidyl or acryloyl groups, may also be used. [See e.g., Joona Bang, Joonwon Bae, Peter Löwenhielm, Christian Spiessberger, Susan A. Given-Beck, Thomas P. Russell, and Craig J. Hawker, "Facile routes to patterned surface neutralization layers for block copolymer lithography", *Advanced Materials*, vol. 19, p. 4552 (2007)].

The neutral surface can also be provided by use of a coating of a crosslinked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations comprising at least one of the foregoing. Herein, where "(meth) acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further comprising at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth) acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth) acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, α-methyl styrene, 4-hydroxy styrene, 4-acetoxy styrene, ethylene, propylene, 1-butene, 1,3-butadiene, vinyl acetate, dihydropyran, norbornene, maleic anhydride, or a combination comprising at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Useful exemplary glycidyl methacrylate polymers are described by Gopalan et. al. [Eungnak Han, Insik In, Sang-Min Park, Young-Hye La, Yao Wang, Paul F. Nealey, and Padma Gopalan, "Photopatternable imaging layers for controlling block copolymer microdomain orientation", *Advanced Materials*, vol. 19, pp. 4448 (2007).]. In an embodiment, specifically useful epoxy-containing polymers include poly(epoxydicyclopentadienyl methacrylate) homopolymer or poly(styrene-ran-epoxydicyclopentadienyl methacrylate), a random copolymer of styrene and expoxydicyclopentadienyl methacrylate.

Organosilicate or silicon oxide-based coatings on the substrate can also be used to provide the neutral surface. In an embodiment, useful surfaces may be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials, may be used to provide the neutral surface, where such organosilicate coatings are advantageously crosslinkable to form a solid neutral surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis(triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

The neutral surface formed on the substrate can be applied by any suitable method and is not particularly limited. Where polymer-based neutral surfaces are desired, the application of such surfaces to a surface of the substrate can be accomplished by a process comprising, for example, spin-casting, dip-coating, doctor blading, spray dispense, or other suitable coating method, which is compatible with the processes and equipment used in microelectronics fabrication assembly lines.

Solvents that can be used to deposit polymeric coatings for the neutral surface vary with the solubility requirements of these materials. Exemplary casting solvents include propylene glycol monomethyl ether acetate (PGMEA), ethoxyethyl propionate, anisole, ethyl lactate, 2-heptanone, cyclohexanone, amyl acetate, γ-butyrolactone (GBL), toluene, and the like.

Substrates on which the neutral surface is formed can include any substrate useful for a desired application such as silicon, silicon oxide, silicon nitride, ceramic, or glass; metals including gold, platinum, aluminum, titanium, alloys thereof, and the like, or any other suitable substrate, the only requirement being that the substrate allow for application of a neutral surface that adheres to the surface of the substrate as disclosed herein.

Implementation of directed self-assembly on sparse chemical patterns as disclosed herein further requires preparation of sparse chemical patterns, followed by directed self-assembly of block copolymer on the sparse chemical patterns. The chemical pattern, formed on the neutral surface, comprises alternating pinning and neutral regions which are chemically distinct and have a spatial frequency that is given by the number of paired sets of pinning and neutral regions for a given direction on the substrate.

The sparse patterns can be created by various processes. In an embodiment, the chemical patterns are formed pattern-wise by directing ultraviolet, x-ray, ion beam, or e-beam irradiation onto the neutral surface of the substrate to generate exposed regions, wherein different chemical properties are induced in the exposed regions relative to the unexposed regions of the neutral surface of the substrate. In another embodiment, the chemical patterns are formed by (a) protecting areas of the neutral surface of the substrate with a patterned resist layer, thereby leaving unprotected areas of the neutral surface of the substrate, (b) generating pinning regions on the unprotected areas of the neutral surface of the substrate by either or both of i) treating the unprotected areas of the neutral surface of the substrate with a chemical treatment, radiation treatment, or plasma treatment, or ii) depositing a layer of material on the unprotected areas of the neutral surface of the substrate to produce a surface having an affinity for at least one domain of the block copolymer assembly, and (c) removing the patterned resist material to uncover the neutral regions of the neutral surface of the substrate.

The chemical patterns can be formed from patterned resist structures comprising positive-tone, negative-tone, or hardened positive-tone resist features on the neutral surface of the substrate, where the patterned resist forms the pinning region of the chemical pattern.

In an exemplary method of forming chemical pattern, (i) a neutral surface is prepared by grafting or crosslinking polymeric materials on a substrate to provide neutral regions. A very thin (<10 nm) film of a negative-tone or hardenable positive-tone resist is deposited on the neutral surface and patterned to create the chemical pattern (i.e., the pinning regions). This deposition and patterning can be performed simultaneously, for example using dip-pen lithography. Post treatment of the chemical patterns (i.e., the patterned resist), as with for example a hardening agent, or surface modification agent (for example, a silylating agent) can optionally be performed. The neutral regions must maintain their neutral character following the resist patterning process, and the final thickness of resist features (i.e., pinning regions) should be as small as possible relative to the surrounding neutral surface to avoid a competing topographical effect on BCP assembly alignment.

In another exemplary method (ii), a neutral surface is prepared by grafting or crosslinking polymeric materials on the substrate to provide neutral regions. As above, a resist film is deposited and patterned to provide protected regions of the neutral surface. The neutral surface (i.e., the areas not protected by the patterned resist) is then exposed to and chemically altered relative to the protected neutral surface by irradiation using a photon, ion, or plasma source thereby leaving pinning regions for sparse chemical patterns, and the resist is removed to uncover the protected neutral surface regions. Additional treatment of the chemical pattern (either the exposed or unexposed regions) can optionally be done. The neutral regions must maintain their neutral character following the resist patterning process.

In another exemplary method of forming chemical pattern (iii), a neutral surface is prepared by grafting or crosslinking a very thin (<10 nm) film of polymeric material or self-assembled monolayer onto a non-neutral substrate to provide patterned neutral regions. In this method, the non-neutral surface regions not covered by the neutral layer serve as pinning regions. The patterning of the neutral regions can be achieved, for example, by lithographic patterning of a photo-patternable, crosslinkable material, or by protection of the non-neutral surface with a patterned photoresist followed by deposition of the neutral material and subsequent lift-off of the photoresist to uncover the non-neutral regions. The final thickness of the neutral film should be as small as possible to avoid a competing topographical effect on BCP assembly alignment. Thus, in an embodiment, the chemical patterns are formed by forming a neutral layer pattern-wise on a non-neutral substrate to form uncovered regions and covered regions covered by the patterned neutral layer. The uncovered regions of the non-neutral substrate are the pinning regions and have different chemical properties than the regions covered by the patterned neutral layer.

The difference in thickness between the neutral and pinning regions of the chemical pattern should be as small as possible. In an embodiment, the difference in height between the neutral and pinning regions is less than or equal to 10 nm. In a specific embodiment, the difference in height between the neutral and pinning regions is less than or equal to 5 nm, specifically less than or equal to 3 nm. Maintaining a minimum topographical difference (i.e., height difference, also referred to as thickness difference) between the pinning and neutral regions is desirable to avoid a competing topographical effect (as found in a graphoepitaxial approach). In this way, in the method described herein, the wetting affinity of the chemical pattern predominates in directing the self-assembly of the domains on the chemical pattern, over any affinity the topographical difference may have for directing the self-assembly of the block copolymer assembly. Thus, any disadvantageous self-assembly, film formation, or pattern transfer effects that could result from too great a topographical difference in the chemical pattern are minimized.

After application, the block copolymer assembly can be further initially processed. In an embodiment, the block copolymer assembly can be baked at elevated temperature to remove solvent and condense the film, and/or annealed as described hereinabove. In an embodiment, baking can be done at a temperature of 70 to 300° C. for at least 20 seconds, specifically for 20 to 180 seconds.

The block copolymer of the block copolymer assembly comprises blocks comprising one or more monomers, and at least two blocks in the block copolymer are compositionally, structurally, or both compositionally and structurally non-identical. The block copolymers used on the sparse chemical patterns include diblock copolymers, triblock copolymers or terpolymers, or multiblock copolymers or terpolymers, any of which can be used in conjunction with sparse chemical patterns to further enhance the resolution. The blocks themselves can be homopolymers or copolymers. Different kinds of block copolymers can be used in the block copolymer assembly, including an amphiphilic organic block copolymer, amphiphilic inorganic block copolymer, organic diblock copolymer, organic multi-block copolymer, inorganic-containing diblock copolymer, inorganic-containing multi-block copolymer, linear block copolymer, star block copolymer, dendritic block copolymer, hyperbranched block copolymer, graft block copolymer, or a combination comprising at least one of the foregoing block copolymers. In an embodiment, the block copolymer is a diblock copolymer. Combining a suitable triblock copolymer/terpolymer and a sparse chemical pattern for frequency doubling can, in an embodiment, be used to quadruple the frequency of the pre-pattern in one spin-and-bake step.

Where used, inorganic constituents of inorganic-containing polymers, including inorganic-containing homopolymers, copolymers, and block copolymers, and inorganic-containing monomers, molecules, and additives include, for example, those based on silicon, germanium, iron, titanium, aluminum, or the like. Exemplary silicon- and germanium-containing monomers and polymers can include those disclosed by H. Ito in "Chemical Amplification Resists for Microlithography" *Adv. Polym. Sci.*, vol. 172, pp. 37-245 (2005); exemplary metal containing monomers and polymers include those disclosed by Ian Manners in "Synthetic Metal-containing Polymers", Wiley-VCH, 2004; exemplary silicon-containing molecules and additives such as organosilicates include those disclosed by E. M. Freer, L. E. Krupp, W. D. Hinsberg, P. M. Rice, J. L. Hedrick, J. N. Cha, R. D. Miller, and H. C. Kim in "Oriented mesoporous organosilicate thin films", *Nano Letters*, vol. 5, 2014 (2005); and exemplary metal-containing molecules and additives include those disclosed by Jinan Chai, Dong Wang, Xiangning Fan, and Jillian M. Buriak, "Assembly of aligned linear metallic patterns on silicon", *Nature Nanotechnology*, vol. 2, p. 500, (2007).

The blocks can in general be any appropriate microdomain-forming block to which another, dissimilar block can be attached. Blocks can be derived from different polymerizable monomers, where the blocks can include but are not limited to: polyolefins including polydienes, polyethers including poly(alkylene oxides) such as poly(ethylene oxide), poly(propylene oxide), poly(butylene oxide), or random or block copolymers of these; poly((meth)acrylates), polystyrenes, polyesters, polyorganosiloxanes, polyorganogermanes, and the like.

In an embodiment, the blocks of the block copolymer comprise as monomers $C_{2-30}$ olefinic monomers, (meth)acrylate monomers derived from $C_{1-30}$ alcohols, inorganic-containing monomers including those based on Fe, Si, Ge, Sn, Al, Ti, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or α-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth)acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, or hydroxyethyl (meth)acrylate. Combinations of two or more of these monomers can be used. Exemplary blocks which are homopolymers can include blocks prepared using styrene (i.e., polystyrene blocks), or (meth) acrylate homopolymeric blocks such as poly(methylmethacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Exemplary block copolymers that are contemplated for use in the present method include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the foregoing block copolymers.

The block copolymer desirably has an overall molecular weight and polydispersity amenable to further processing. In an embodiment, the block copolymer has a weight-averaged molecular weight (Mw) of 3,000 to 100,000 g/mol. Similarly, the block copolymer has a number averaged molecular weight (Mn) of 1,000 to 60,000. The block copolymer can also have a polydispersity (Mw/Mn) of 1.01 to 6, and is not particularly limited thereto. Molecular weight, both Mw and Mn, can be determined by, for example, gel permeation chromatography using a universal calibration method, calibrated to polystyrene standards.

The block copolymer assembly comprising the block copolymer is desirably provided as a solution in an appropriate solvent for any application method selected. The block copolymer assembly layer comprising block copolymers that form microphase-separated domains, is formed on the neutral surface of the substrate on which the chemical pattern is formed.

Solvents that can be used vary with the solubility requirements of the block copolymer assembly components. Exemplary casting solvents for the block copolymer assembly include propylene glycol monomethyl ether acetate (PGMEA), ethoxyethyl propionate, anisole, ethyl lactate, 2-heptanone, cyclohexanone, amyl acetate, γ-butyrolactone (GBL), toluene, and the like. In an embodiment, specifically useful casting solvents include propylene glycol monomethyl ether acetate (PGMEA), γ-butyrolactone (GBL), or a combination of these solvents.

The block copolymer assembly can comprise additional components and/or additives selected from the group consisting of: additional polymers, including homopolymers, random copolymers, crosslinkable polymers, inorganic-containing polymers; additives including small molecules, inorganic-containing molecules, surfactants, photoacid generators, thermal acid generators, quenchers, hardeners, crosslinkers, chain extenders, and the like; and combinations comprising at least one of the foregoing, wherein one or more of the additional components and/or additives co-assemble with the block copolymer to form the block copolymer assembly.

Spin casting (including spin drying) can in some embodiments suffice to form the block copolymer assembly. In other embodiments, domain formation occurs during applying, baking, annealing, or during a combination of one or more of these operations. In this way, an oriented block copolymer assembly is prepared by the above method, having microphase-separated domains that comprise cylindrical microdomains oriented perpendicular to the neutral surface, or that comprise lamellar domains oriented perpendicular to the neutral surface. In an embodiment, the microphase-separated domains are lamellar domains oriented perpendicular to the neutral surface, which provide parallel line/space patterns in the block copolymer assembly.

The domains, so oriented, are desirably thermally stable under further processing conditions. Thus, after coating a layer of a block copolymer assembly including a useful diblock copolymer such as, for example, poly(styrene-b-methyl methacrylate), and optionally baking and/or annealing, the domains of the block copolymer will form on and remain perpendicular to the neutral surface.

In an embodiment, domains comprising blocks of the block copolymer assembly form on the chemical pattern, wherein the domains form by lateral segregation of the blocks, at least one domain has an affinity for the pinning regions and forms on the pinning region, and the domains so formed are aligned with the underlying chemical pattern. Domains that do not form on the pinning region form adjacent to and are aligned with the domains formed on the pinning regions, such that a structure comprising repeating sets of domains is formed on the chemical pattern with a spatial frequency for the domains (given by the number of repeating sets of domains in the given direction) of at least twice that of the spatial frequency for the chemical pattern.

In an embodiment, domains corresponding to each block of a block copolymer are formed. Where a diblock copolymer is used, some domains formed have a greater affinity for the pinning region than the other domain and forms over the pinning regions, the other domains form over a portion of the neutral region that are adjacent to the pinning region. A fraction of the domains having the greater affinity is not pinned. The diblock copolymer assembly then forms additional domains on the neutral region that are adjacent to and aligned with the domains formed on the pinning region. In an embodiment, at least 50% of the domains having the greatest affinity are not pinned.

In an embodiment, polymer structures can be formed by applying a solution comprising at least one block copolymer, to a neutral surface of a substrate having a chemical pattern thereon, the chemical pattern comprising alternating pinning and neutral regions which are chemically distinct and which have a first spatial frequency given by the number of paired sets of pinning and neutral regions along a given direction on the substrate; and forming domains comprising blocks of the block copolymer, where the domains form by lateral segregation of the blocks, wherein at least one domain has an affinity for and forms on the pinning regions, and the pinning regions pin domains having the greatest affinity, such that a structure comprising repeating sets of pinned domains and domains aligned with the pinned domains is formed on the surface, the structure having a second spatial frequency given by the number of repeating sets of domains in the given direction, the second spatial frequency being at least twice that of the first spatial frequency.

In another embodiment, polymer structures can be formed by applying a solution comprising at least one block copolymer, to a neutral surface of a substrate having a chemical pattern thereon, the chemical pattern comprising alternating pinning and neutral regions that are chemically distinct and have a first spatial frequency given by the number of paired sets of pinning and neutral regions along a given direction on the substrate; and forming domains of the block copolymer which form by lateral segregation of the blocks in accordance with the underlying chemical pattern, wherein at least one domain of the block copolymer assembly has an affinity for the pinning regions, and wherein a structure extending across the chemical pattern is produced, the structure having a uniform second spatial frequency given by the number of repeating sets of domains in the given direction that is at least twice that of the first spatial frequency.

An exemplary process flow for directed self-assembly on sparse chemical patterns thus comprises (i) preparing a solution containing at least one block copolymer, optionally with additional block copolymers, homopolymers, surfactants and/or photoacid generators included; (ii) casting the solution on the sparse chemical patterned substrates; (iii) forming well-aligned polymer domains on sparse chemical pattern with frequency multiplication at least twice that of the sparse chemical pattern; (iv) optionally, annealing (including thermal annealing, thermal gradient annealing, solvent vapor annealing or other gradient field) of the block copolymer assembly to remove defects; and (v) selectively removing or decorating aligned polymer domains to generate chemical or topographical contrast for subsequent patterning steps.

A topographical pattern is formed in the block copolymer assembly to provide for transfer of the pattern to the substrate. In a film comprising the block copolymer assembly having microphase-separated domains, those domains having a common composition can be selectively removed by a suitable process such as wet or dry etch, development, or solvent solubility, so that one domain comprising one kind of block is selectively removed over another domain comprising another kind of block. Thus, in an embodiment, a microphase-separated domain of the block copolymer assembly is selectively removed to provide a topographical pattern. The topographical pattern can then be transferred to the substrate by a suitable subsequent etch process. In an embodiment, the topographical pattern is generated by selectively etching a domain having a higher etch rate than the other domain(s) by an oxygen plasma etch.

The pattern forming method disclosed herein maybe used in an imaging scheme such as a bilayer or trilayer scheme, for high-resolution patterning of a substrate. In a bilayer scheme, the block copolymer of the block copolymer assembly can have a block comprising inorganic-containing monomers (such as silicon or germanium containing monomers) that is etch resistant to the etch used to establish the topographical pattern. Alternatively, the block copolymer assembly can comprise, in addition to the block copolymer, inorganic-containing polymers (such as germanium-containing polymers or silicon-containing polymers) and/or inorganic-containing molecules (such as silicon-containing or germanium-containing molecules), which co-assemble with microphase-separated domains of the block copolymer to form the block copolymer assembly such that domains are formed which are highly etch resistant to oxygen plasma etch (such as that used to open the topographic pattern in the block copolymer assembly). In this instance, the neutral surface layer can either be disposed over an etchable organic pattern transfer layer, or alternatively, where the neutral surface layer is a polymer having the desired etch characteristics, the neutral surface layer may also act as a pattern transfer layer. The pattern of the block copolymer assembly can in this way be transferred through the neutral surface layer to the pattern transfer layer. After pattern formation in the pattern transfer layer, pattern transfer to the substrate is effected by an appropriate substrate etch process.

In other embodiments, a trilayer scheme is contemplated, in which the block copolymer assembly is disposed on a surface of the neutral surface layer, which in turn is disposed on a hardmask material. In another embodiment, the neutral surface layer can double as the hardmask material, such as for example, where the neutral surface layer comprises an organosilicate layer or other suitable etch-resistant material. The hardmask is in turn disposed on an organic pattern transfer layer, which is disposed on a surface of a substrate. In a trilayer scheme, the pattern is transferred from the patterned block copolymer assembly to the hardmask by an etch process such as a halogen etch. The pattern is then transferred from the patterned hardmask to the relatively thick pattern transfer layer by an oxygen plasma etch. Once the pattern is successfully transferred into the pattern transfer layer, it can be transferred into the substrate using an appropriate etch process, without difficulty.

Articles can be prepared using the method described hereinabove. As one example, one or more aspects of the present invention can be included in an article of manufacture, e.g., one or more computer hardware products such as permanent or rewriteable data storage media such as hard disks readable by a machine, employing, for instance, computer usable media. The media has embodied therein, for instance, computer readable program code means for providing and facilitating the capabilities of the present invention. The article of manufacture can be included as a part of a computer system or sold separately. Other exemplary applications include fabrication of semiconductors including microprocessors, ASICs, and/or memory chips including DRAM, SRAM, Flash, and the like.

The flow diagrams of the figures depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

The invention is further described with respect to the examples, below.

The following examples are intended to provide those of ordinary skill in the art with a complete disclosure and description of how to prepare and use the compositions disclosed and claimed herein. Efforts have been made to ensure accuracy with respect to measured numbers, but allowance should be made for the possibility of errors and deviations.

EXAMPLE 1

Figure 3:
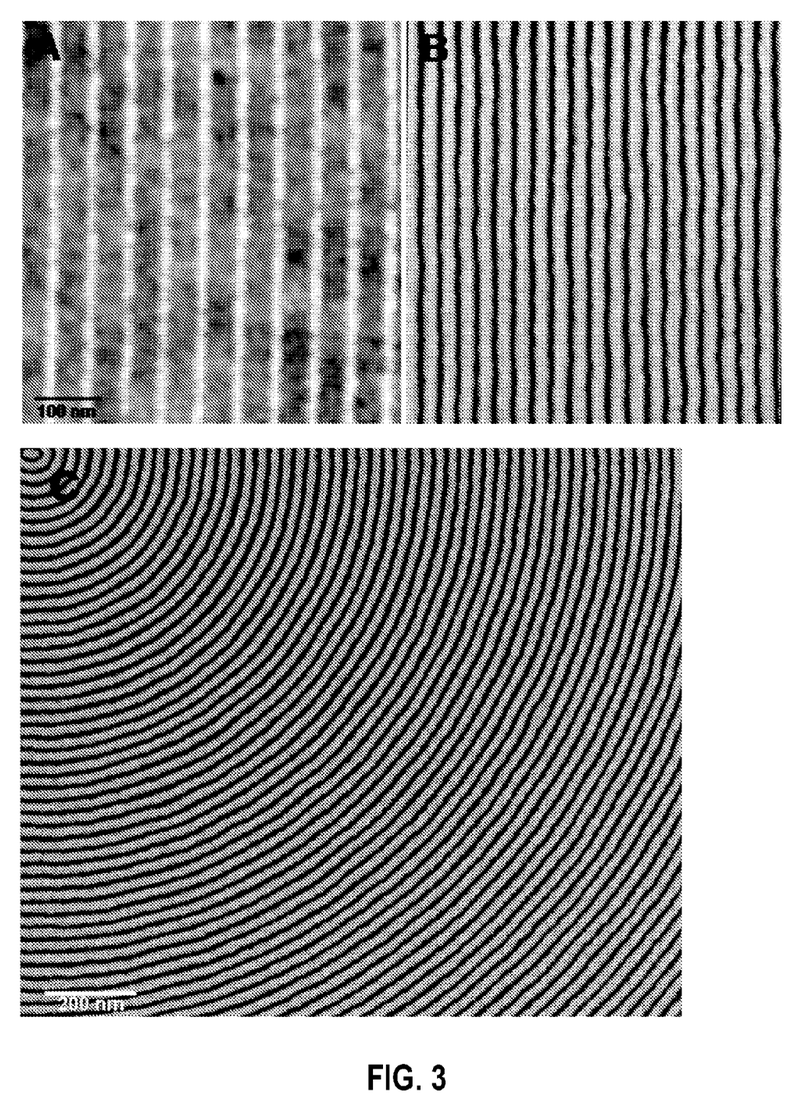
FIG. 3 illustrates an exemplary spatial frequency doubling in which parallel hydridosilsesquioxane lines imaged on a crosslinked poly(epoxydicyclopentadienyl methacrylate epoxide-ran-styrene) neutral surface serve as chemical patterns (with an atomic force microscope (AFM) image shown in FIG. 3A), to direct the self-assembly of a poly(styrene-b-methyl methacrylate) diblock copolymer and afford a doubling of the spatial frequency (FIG. 3B), and frequency doubling over a similar chemical pattern of concentric lines (FIG. 3C), and wherein the scanning electron micrographs in FIG. 3B and FIG. 3C show the block copolymer assembly after the PMMA domains have been removed by oxygen reactive ion etching.

A sparse chemical pattern was prepared by a two-layer method in which a thin coating of hydridosilsesquioxane (HSQ) was cast on the top surface of cross-linked poly(epoxydicyclopentadienyl methacrylate epoxide-ran-styrene) (30:70 molar ratio, respectively; also abbreviated as PEpoxyDCPMA$_{30}$-r-PS$_{70}$), on a silicon substrate. The PEpoxyDCPMA$_{30}$-r-PS$_{70}$ layer was crosslinked using N-hydroxyphthalimide triflate as a thermal acid generator (10 wt % based on the total weight of thermal acid generator and polymer) by baking at 130° C. for 1 minute and then at 200° C. for 2 minutes. The PEpoxyDCPMA$_{30}$-r-PS$_{70}$ provided a neutral surface for poly(styrene-b-methylmethacrylate) (abbreviated as "PS-b-PMMA"), and HSQ provided a preferentially wettable surface for PMMA. The HSQ layer was imaged by direct write electron beam lithography and developed using an 0.26N tetramethylammonium hydroxide (TMAH) developer to generate a pattern of thin stripes having a total pitch of 57.5 nm, HSQ line width of 15 nm and HSQ line height of 2.5 nm (See FIG. 3A). A 1 wt % solution of PS-b-PMMA (Mw of each block of 18,000 g/mol/18,000 g/mol respectively, obtained from Polymer Source) in PGMEA was cast on the chemical patterns of HSQ/PEpoxyDCPMA$_{30}$-r-PS$_{70}$ and baked at 200° C. for 5 minute. The polymer domains in PS-b-PMMA thin film self-aligns on the top of the sparse chemical pattern to form a frequency double alternating PS/PMMA stripes with pitch of about 28.8 nm (FIG. 3B). In addition, frequency doubling of curved line-space patterns can be achieved by casting and baking PS-b-PMMA on sparse chemical patterns of concentric rings of HSQ on PEpoxyDCPMA-r-PS (FIG. 3C). PS-b-PMMA concentric rings with a pitch of about 28.8 nm, double the spatial frequency of HSQ concentric rings with a pitch of 57.5 nm, a width of 15 nm and a height of 2.5 nm, were obtained in this way as shown in FIG. 3C. This experiment indicates that it is feasible to multiply the spatial frequency of arbitrary patterns based on directed self-assembly on sparse chemical patterns.

EXAMPLE 2

Figure 4:
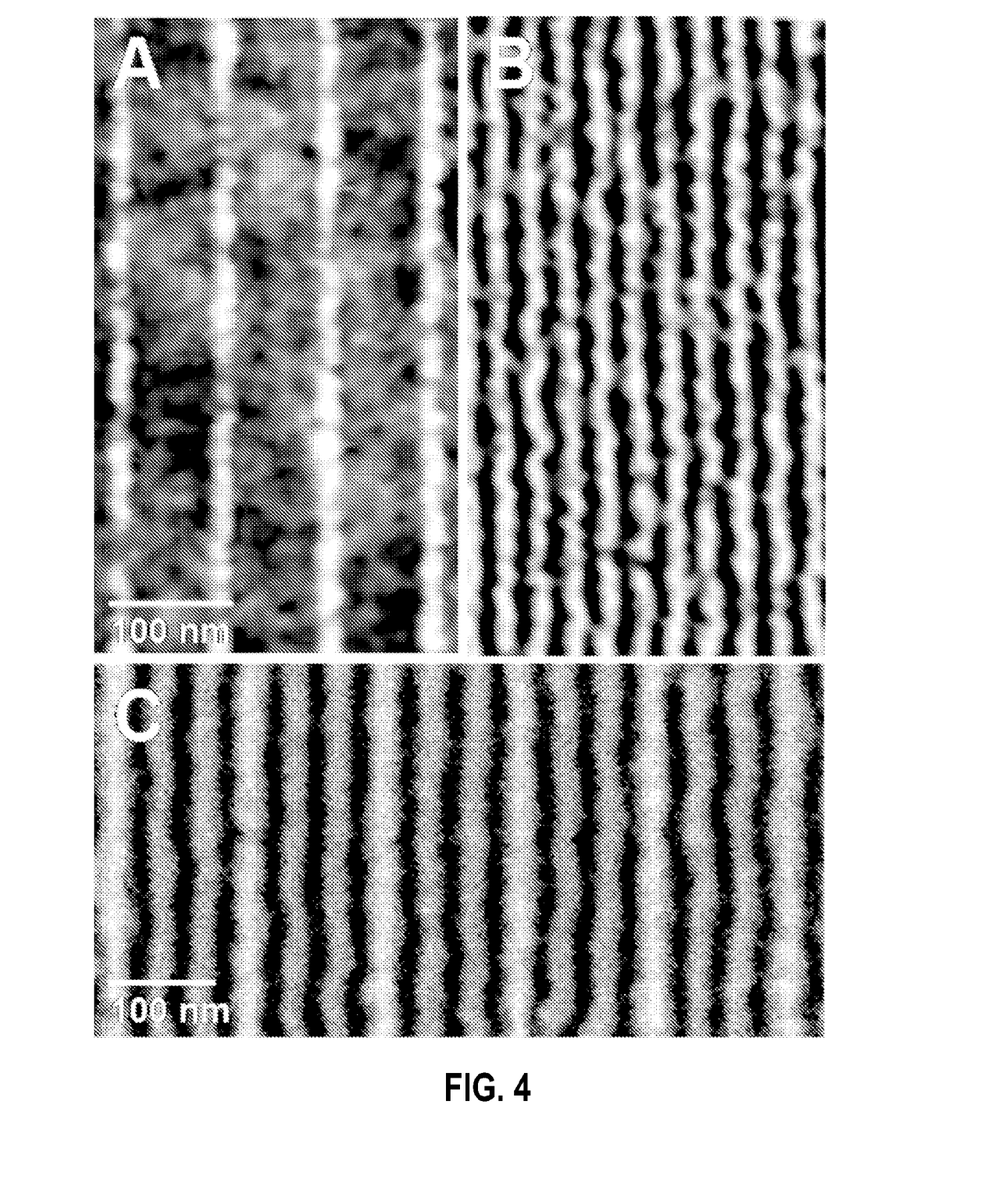
FIG. 4 illustrates an exemplary spatial frequency tripling in which parallel hydridosilsesquioxane lines imaged on a crosslinked poly(epoxydicyclopentadienyl methacrylate epoxide-ran-styrene) neutral surface serve as chemical patterns (AFM image shown in FIG. 4A), which direct the self-assembly of a poly(styrene-b-methyl methacrylate) diblock copolymer and afford a tripling of the spatial frequency (AFM image shown in FIG. 4B), and in an alternative embodiment, where a chemical pattern of parallel lines of chromium on an organosilicate substrate directs the self-assembly of a poly(styrene-b-ethylene oxide) diblock copolymer/organosilicate mixture and affords a tripling of the spatial frequency (scanning electron micrograph (SEM) image after baking to remove the organic block copolymer shown in FIG. 4C)

A sparse chemical pattern was made by a two-layer process as described in Example 1, with the chemical pattern prepared from a thin coating of hydridosilsesquioxane (HSQ) formed on thermally cross-linked PEpoxyDCPMA$_{30}$-r-PS$_{70}$. The HSQ layer was imaged and developed as in Example 1 to generate thin stripes with a pitch of 87.5 nm, an HSQ line width of 20 nm and an HSQ line height of 2.5 nm (FIG. 4A). A 1.5 wt % solution of PS-b-PMMA in PGMEA was then cast on the sparse chemical patterns of HSQ/PEpoxyDCPMA-r-PS and baked at 240° C. for 1 minute. The polymer domains in the PS-b-PMMA film self-aligned on top of the sparse chemical pattern to form a frequency tripled pattern of alternating PS and PMMA stripes with pitch of about 28.2 nm (FIG. 4B).

EXAMPLE 3

A sparse chemical pattern was prepared by a two-layer method in which thin chromium (Cr) stripes were formed on the top surface of a thermally cross-linked organosilicate (OS) underlayer. The OS is a copolymer of methyltrimethoxysilane and tetraethoxysilane with a molecular weight Mw of 2,000 g/mol. The OS underlayer provides a neutral surface for the assembly of domains of the poly(styrene-b-ethylene oxide) (abbreviated PS-b-PEO, obtained from Polymer Source, with a molecular weight Mw for the PS block of 19,000 g/mol and for the PEO of 12,300 g/mol) cast along with a co-assembling OS component. The Cr surface serves as a preferentially wetted area for the PEO/OS domains. The sparse chemical pattern of thin Cr stripes having a pitch of 132 nm, a Cr linewidth of 20 nm, and a Cr line thickness of 2.5 nm was made by Cr deposition and liftoff of Cr from electron-beam patterned PMMA on the top surface of the OS underlayer. A 1% wt solution of PS-b-PEO and OS component (PS-b-PEO: OS=60:40) in PGMEA was cast on the sparse chemical patterns to form self-assembled domains with a pitch of 44 nm, thereby tripling the spatial frequency of the underlying Cr/OS chemical patterns as shown in FIG. 4C.

EXAMPLE 4

Figure 5A:
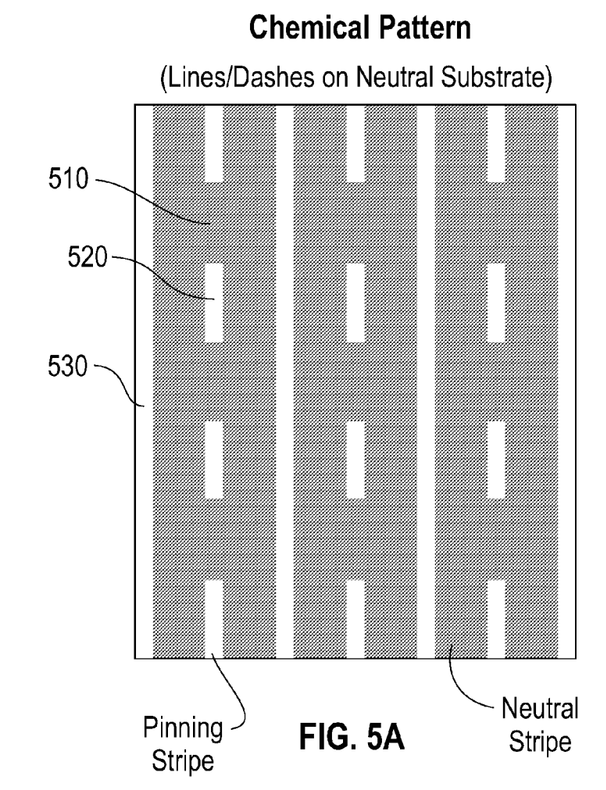
FIG. 5 illustrates an exemplary embodiment in which an intermittent chemical pattern of lines and dashes (FIG. 5A) provides a contiguous pattern of aligned domains (FIG. 5B), and a SEM image showing an exemplary spatial frequency multiplication, in which hydridosilsesquioxane lines imaged on a crosslinked poly(epoxydicyclopentadienyl methacrylate-ran-styrene) neutral surface (FIG. 5C), exhibit frequency multiplication with application of a poly(styrene-b-methyl methacrylate) diblock copolymer (FIG. 5D)
Figure 5B:
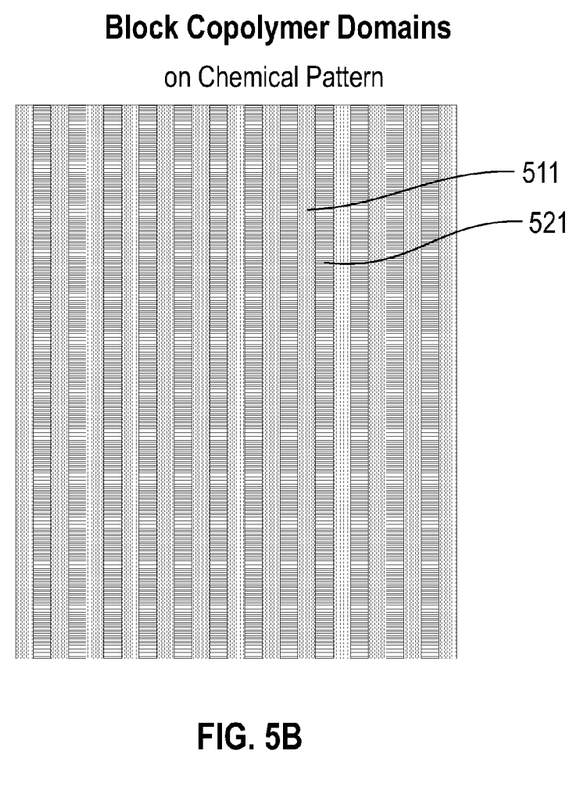
Figure 5C:
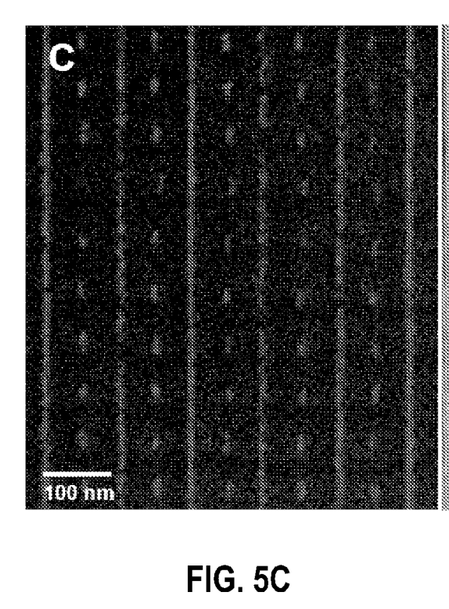
Figure 5D:
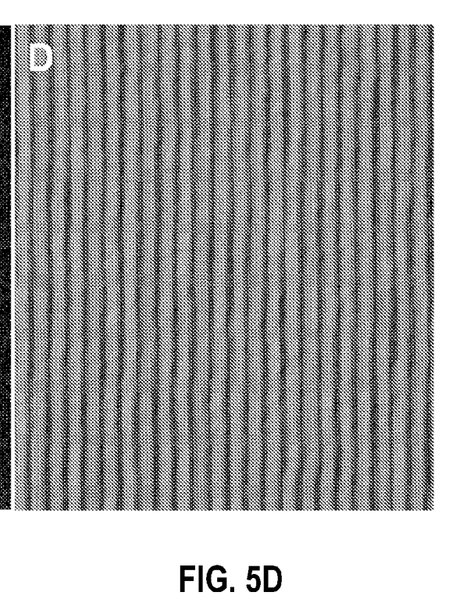

A sparse chemical pattern was made by a two-layer process as describe for Example 1, with the chemical pattern prepared from a thin coating of hydridosilsesquioxane (HSQ) formed on thermally cross-linked PEpoxyDCPMA$_{30}$-r-PS$_{70}$. The HSQ layer was imaged and developed as in Example 1 to generate thin stripes of solid lines and dashed lines with a pitch of 57.5 nm, an HSQ line width of 15 nm and an HSQ line height of 2.5 nm (FIG. 5C). A 1.5 wt % solution of PS-b-PMMA in PGMEA was then cast on the sparse chemical patterns of HSQ/PEpoxyDCPMA-r-PS and baked at 240° C. for 1 minute. The polymer domains in the PS-b-PMMA film self-aligned on the top of the sparse chemical pattern to form a frequency doubled pattern of alternating PS and PMMA stripes with pitch of about 28.2 nm (FIG. 5D).

There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of forming polymer structures, comprising:

applying a solution of a diblock copolymer assembly comprising at least one diblock copolymer that forms lamellae, to a neutral surface of a substrate having a chemical pattern thereon, the chemical pattern comprising alternating pinning and neutral regions that are chemically distinct and have a pitch equal to at least twice that of the diblock copolymer assembly, wherein a first spatial frequency of the chemical pattern is given by the number of paired sets of pinning and neutral regions along a given direction on the substrate, wherein the width of the pinning regions is less than or equal to about one-half of the width of the neutral regions; and forming domains comprising blocks of the diblock copolymer, wherein the domains form by lateral segregation of the blocks, wherein at least one domain has an affinity for the pinning regions and forms on the pinning region, wherein the domains so formed are aligned with the underlying chemical pattern, wherein domains that do not form on the pinning region form adjacent to and are aligned with the domains formed on the pinning regions, such that a structure comprising repeating sets of domains is formed on the chemical pattern with a second spatial frequency given by the number of repeating sets of domains along the given direction, the second spatial frequency being at least twice that of the first spatial frequency.

* * * * *